(12) United States Patent
Radosavljevic et al.

(10) Patent No.: US 8,012,816 B2
(45) Date of Patent: Sep. 6, 2011

(54) DOUBLE PASS FORMATION OF A DEEP QUANTUM WELL IN ENHANCEMENT MODE III-V DEVICES

(75) Inventors: Marko Radosavljevic, Beaverton, OR (US); Benjamin Chu-Kung, Hillsboro, OR (US); Mantu K. Hudait, Portland, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 360 days.

(21) Appl. No.: 12/347,925

(22) Filed: Dec. 31, 2008

(65) Prior Publication Data

US 2010/0163849 A1      Jul. 1, 2010

(51) Int. Cl.
*H01L 21/338* (2006.01)
*H01L 21/3205* (2006.01)
*H01L 21/4763* (2006.01)

(52) U.S. Cl. .......... 438/172; 438/585; 257/E21.409

(58) Field of Classification Search .......... 438/172, 438/585; 257/E21.409
See application file for complete search history.

(56) References Cited

U.S. PATENT DOCUMENTS 7,557,038 B2 *   7/2009   Hwang .............. 438/672

* cited by examiner

*Primary Examiner* — Alexander G Ghyka
*Assistant Examiner* — Seahvosh J Nikmanesh
(74) *Attorney, Agent, or Firm* — Blakely, Sokoloff, Taylor & Zafman LLP

(57) ABSTRACT

A quantum well is formed for a deep well III-V semiconductor device using double pass patterning. In one example, the well is formed by forming a first photolithography pattern over terminals on a material stack, etching a well between the terminals using the first photolithography patterning, removing the first photolithography pattern, forming a second photolithography pattern over the terminals and at least a portion of the well, deepening the well between the terminals by etching using the second photolithography pattern, removing the second photolithography pattern, and finishing the terminals and the well to form a device on the material stack.

11 Claims, 3 Drawing Sheets

1

DOUBLE PASS FORMATION OF A DEEP QUANTUM WELL IN ENHANCEMENT MODE III-V DEVICES

BACKGROUND

Field

The present description relates to formation of quantum well semiconductor devices and, in particular to forming a deep well using double pass patterning.

Semiconductor integrated circuits contain large arrays of electronic devices, most of which are transistors. Since integrated circuits are formed by building up layers of materials in various patterns, flat structures and structures that only use three or four layers are the easiest structures to create. Creating deeper structures can be very difficult, depending on the particular chemistry of the structure. There is a demand for transistors that vertically are much deeper than is currently offered with most simple processes.

As integrated circuit technology continues to scale down, energy efficiency becomes increasingly important. To that end, group III-V semiconductor materials have been proposed for use in future generation transistors because of their ability to enable high-speed switching at low supply voltages due to their excellent low and high-field electron transport properties. Group III-V materials are synthesized using elements from the 3rd and the 5th group of the periodic table, examples include gallium arsenide (GaAs), indium gallium arsenide (InGaAs), gallium phosphide (GaP), gallium nitride (GaN), gallium aluminum arsenide (GaAlAs), indium aluminum arsenide (InAlAs), indium phosphide (InP), indium arsenide (InAs), and indium antimonide (InSb).

Deep transistor structures built using III-V materials are believed to be particularly effective for high speed logic circuits. However, it is currently very difficult to integrate deep vertically recessed gate structures in scaled, enhancement III-V quantum well transistors. Current gate structures present too much lateral undercut to significantly reduce the external resistance. Typical III-V devices are fabricated using a gate recess technique to enable higher speed and low power. Most of these recess techniques are wet etch based because III-V materials are hard to dry etch. Dry etch typically induces too much damage. The wet etch although more benign in terms of damage leaves an isotropic etch profile which induces undercut portions of the device that contribute to external resistance.

As a result, vertically recessed structures are not being built in III-V transistors today since a vertically recessed structure is only useful for logic operations in which electrostatic integrity is key. For low-noise amplifier applications only a shallow vertical recess is required. The shallow recess is less affected by lateral undercut or external resistances.

BRIEF DESCRIPTION OF THE DRAWING FIGURES

Embodiments of the present invention may be understood more fully from the detailed description given below and from the accompanying drawings of various embodiments of the invention. The drawings, however, should not be taken to be limiting, but are for explanation and understanding only.

DETAILED DESCRIPTION

Embodiments of the present invention enable vertically recessed enhancement mode III-V devices. The issues of dry etch damage and wet etch isotropic etch profile can be overcome by enabling anisotropic-like wet etch via (a) a dual patterning technique that creates temporary spacers which protect the material from undercutting and (b) adding an atomic layer deposition (ALD) high-k (high dielectric constant) dielectric to serve both as a gate oxide and a thin spacer between the source, drain, and gate metals.

Embodiments of the present invention allow for a III-V quantum well (QW) structure with a thin layer of channel material such as InGaAs, sandwiched by high bandgap spacer materials such InAlAs. The resulting enhancement mode III-V quantum well transistors have deep vertical recessed gate structures. A dual patterning strategy allows for a temporary spacer for anisotropic wet etch for a vertical recess gate. This dual patterning wet etch minimizes the lateral undercut and its associated external resistance penalty. Further benefits are provided by integrating an ALD high-k dielectric to serve both as a gate oxide and a thin spacer between source, drain, and gate metals.

By integrating a dual patterning, temporary spacer architecture, an anisotropic wet etch may be used to achieve a deep gate recess without lateral undercut or associated external resistance penalty. This approach is also compatible with the integration of high-k dielectrics, providing a path to reduce gate leakage. Gate leakage may be important in constructing logic devices.

Figure 1:
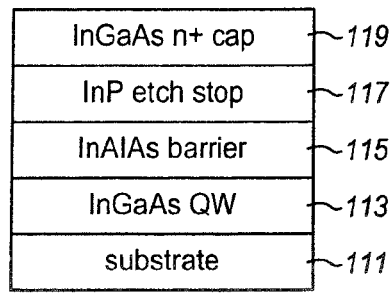
FIG. 1 is a cross-sectional diagram of a portion of a material stack suitable for use with the present invention.

Referring to the figures, FIG. 1 shows an appropriate material stack that may be used as a starting point for forming a deep well III-V quantum well transistor. The stack has a substrate base 111 upon which the other layers are formed.

The substrate is generally a semiconductor substrate and may be formed from known semiconductor materials, such as silicon or silicon-containing materials, germanium or germanium-containing materials, or other group IV containing materials. In some implementations the substrate may be formed from, or include, a III-V material such as GaAs, GaP, GaN, GaAlAs, InAlAs, InP, and InAs.

In the example of FIG. 1, an InGaAs quantum well layer 113 is formed over the substrate. An InAlAs barrier layer 115 is formed over the quantum well. An InP etch stop layer 117 is formed over the barrier and an InGaAs n+ cap layer 119 is formed over the etch stop layer. These layers may be formed in a variety of different ways and the particular materials may be modified to suit particular applications. The illustrated material stack is shown only as an example. A variety of other quantum well stacks may alternatively be used such as an InAlAs/InGaAs system, with AlGaAs/GaAs, or AlInSb/InSb can be substituted for example. Alternate materials that may be used for the quantum well layer include, but are not limited to, inidium alloys, gallium alloys, arsenic alloys, antimony alloys, InGaSb, InAs, and InAsSb. The thickness of the quantum layer may range from one Angstrom (Å) to 100 Å.

The barrier layer serves as a transition between the quantum well layer and additional III-V layers or a gate dielectric layer that are formed above the quantum well layer. The barrier layer is also used to confine the carriers (e.g., electrons or holes) to the quantum well layer. A relatively wide bandgap III-V material may be used as the barrier layer. The wide bandgap ensures that the carriers remain confined in the narrow bandgap quantum well layer. The use of a wide bandgap III-V material also reduces junction leakage and transistor off-state leakage. In implementations of the invention, III-V materials such as GaAs, GaP, GaN, GaAlAs, InAlAs, and InP may be used as the barrier layer. In further implementations, the barrier layer may be counter-doped relative to the quantum well layer to mitigate short channel effects. For instance, the barrier layer may be p-doped if the quantum well layer is n-type or vice versa. The thickness of the III-V barrier layer may range from 1 Å to 100 Å.

The III-V etch stop layer serves to protect the underlying barrier and quantum well layers during the etching processes that subsequently form the source region, the drain region, and the gate stack (e.g., the gate dielectric and the gate electrode). The III-V etch stop layer also serves the conventional purpose of providing an endpoint indicator for the etching processes. A III-V material may be used for compatibility purposes (lattice matched) with the underlying barrier layer. In some implementations, the specific III-V material used in the etch stop may be chosen based on compatibility with the material used in the underlying barrier layer and/or based on the etchant used during fabrication of the source/drain regions and the gate stack (i.e., the etchant should be selective to the material used in the etch stop layer). In some implementations, a III-V material such as InP may be used atop a InAlAs barrier layer. In other implementations, alternate III-V materials may be used, including but not limited to GaAs, GaP, GaN, GaAlAs, and InAlAs. The thickness of the III-V etch stop layer may range from 1 Å to 100 Å.

The III-V capping layer functions as a source extension and a drain extension for the source and drain regions. Accordingly, if the QWFET (QW Field Effect Transistor) being formed is an N-type transistor (i.e., an NMOS (N-type Metal Oxide Semiconductor) transistor), the capping layer may be N+ doped. In an alternate implementation, if the QWFET is a PMOS (P-type Metal Oxide Semiconductor), then the capping layer may be a P+ doped layer. In the examples provided herein, the QWFET is an NMOS device and the capping layer is an N+ doped capping layer. The capping layer may be formed using a high mobility, narrow bandgap III-V material that is compatible with the underlying etch stop layer. In some implementations, the III-V capping layer may be formed using N+ doped InGaAs. In other implementations, alternate III-V materials such as InSb may be used. The thickness of the III-V capping layer may range from 1 Å to 500 Å.

Figure 2:
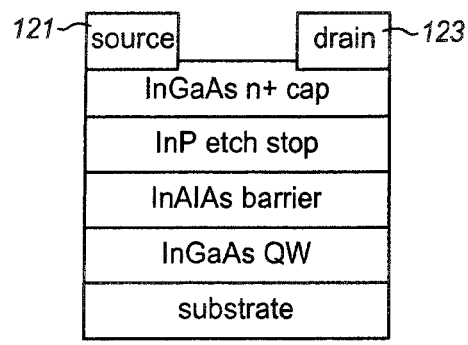
FIG. 2 is a cross-sectional diagram of the material stack of FIG. 1 with transistor terminals applied suitable for use with the present invention.

In FIG. 2, III-V source-drain ohmics have been defined and patterned over the material stack. In the example of FIG. 2, a source 121 has been formed on top of the stack on the left and a drain 123 on the right. These can be formed using any of a variety of different processes and terminal metals, Cu and Al, being among the more likely choices. The particular metal selected will depend on the application for which the resulting transistor is intended.

Typically, NiGeAu or TiPtAu contacts are used for the source and drain in III-V QW systems. However, any low resistivity metals may be used here to form the source and drain regions, including but not limited to copper, aluminum, nickel, and TiW. The patterns can be modified depending on the application as well as the complexity of the process. Typically simple plug type patterns can be used for digital applications. While a source and drain are shown with a gap in between, the particular choice of terminals, their configuration and location may be adapted to suit the fabrication of a variety of different types of devices.

Figures 3A, 3B, 3C:
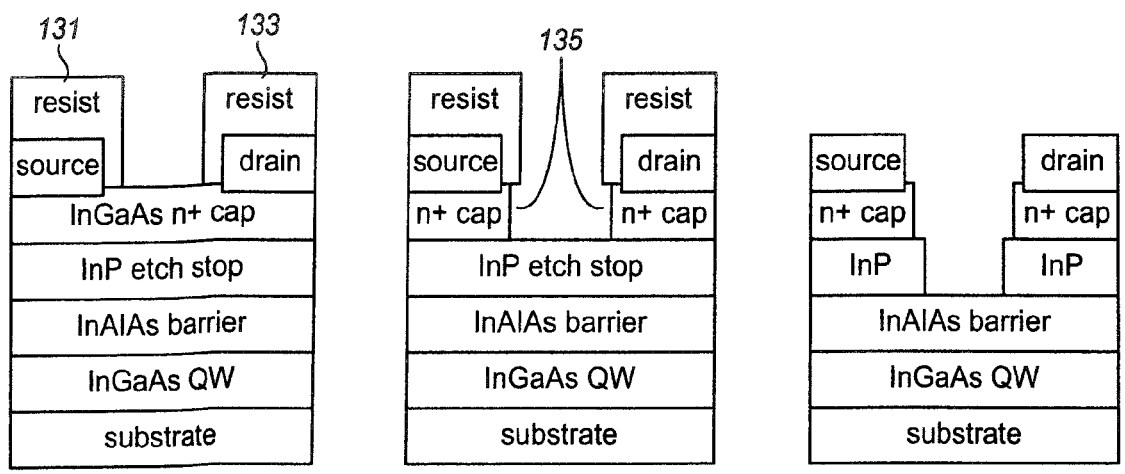
FIG. 3A is a cross-sectional diagram of the formation of FIG. 2 with a first photolithography pattern applied according to an embodiment of the present invention.
FIG. 3B is a cross-sectional diagram of the formation of FIG. 2 after a first etching is applied according to an embodiment of the present invention.
FIG. 3C is a cross-sectional diagram of the formation of FIG. 2 with a first photolithography pattern after a second etching is applied and the photo resist is removed according to an embodiment of the present invention.

FIGS. 3A, 3B, and 3C show a first pass of patterning the deep gates. In FIG. 3A, a layer of photo resist 131, 133 has been formed over the source 121 and drain 123, respectively. This layer protects the source and drain during the first phase of deep patterning. The photo resist may be formed by masking, deposition, and developing, or in any of a variety of other ways, depending on the particular application.

After the resist patterning and development, a wet etch is used to remove the central part of the n+cap layer 119. The wet etch is then followed by a dry etch for to remove the central portion of the InP etch stop layer 117. After the dry etch, the resist layers 131, 133 are removed. The result is shown in FIG. 3C.

Although the wet etch creates a slight undercut 135 in the n+ cap layer 119 as shown in FIG. 3B, this has no negative impact on the resulting structure. As shown in FIG. 3B, this undercut goes away when the resist layer above it is removed. The amount of the undercut can be controlled by limiting the amount of etching through the cap layer.

However, in the second phase, the InAlAs barrier layer 115 is etched. A further vertical recess of the barrier layer may result in additional undercut in the etch stop layer which may affect external resistance. As shown in FIG. 3B, the undercuts are reduced by carefully controlling the etching. In FIG. 3B, the etch stop layer is etched less than the cap layer creating a smaller opening at the bottom of the well than at the top.

Figure 4A:
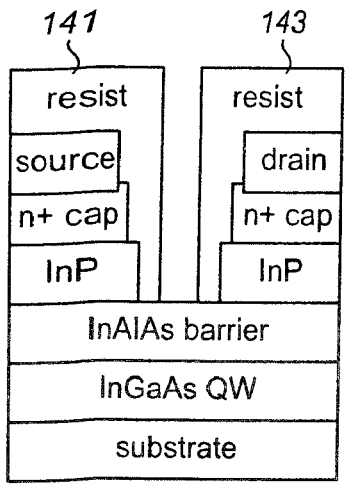
FIG. 4A is a cross-sectional diagram of the formation of FIG. 3C with a second photolithography pattern applied according to an embodiment of the present invention.
Figure 4B:
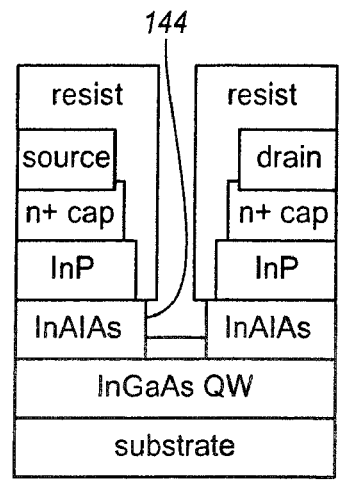
FIG. 4B is a cross-sectional diagram of the formation of FIG. 4A after a second pass etching according to an embodiment of the present invention.
Figure 4C:
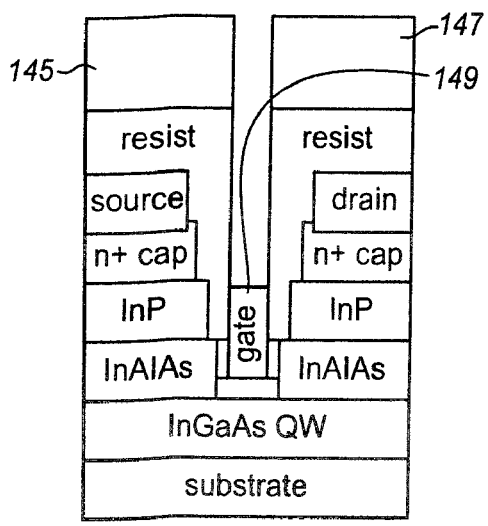
FIG. 4C is a cross-sectional diagram of the formation of FIG. 4B with a gate deposited in the well according to an embodiment of the present invention.

The second pass or phase of patterning the deep gates is shown in FIGS. 4A, 4B, and 4C. This begins again by forming a protective layer of photo resist over the source and drain. As can be seen from FIG. 4A, the first photoresist pattern has operated like a temporary spacer, between the two sides of the well. One section of photo resist 141 is formed over the source 121 and another section of photo resist 143 is formed over the drain 123. Note that these photo resist spacers not only cover the source and drain but extend into the well to cover the sides or exposed edges of the n+ cap layer and the etch stop layer.

As shown in FIG. 3C, when portions of the first two layers were removed to form the well, the edges of the layers were exposed where the portions were removed. These edges from the walls of the well. These edges are now covered in FIG. 4A with the new layer of photo resist. This allows the second phase to be performed without affecting the etching that was performed in the first pass.

After forming the protective resist layers in FIG. 4A with photolithography, a further wet etch is performed to form a recess in the InAlAs barrier layer. This etching, shown in FIG.

4B also causes a lateral undercut as in FIG. 3B. However, the undercut is again less than the thickness of the protected photo resist layer above it. When the photo resist is removed in FIG. 4D, the central well is narrower through the barrier layer than through the etch stop layer and the well is narrower at the etch stop layer than at the n+ cap layer.

In this second photolithography step the resist spacers 141, 143 over the n+cap layer 119 protect it while the InAlAs barrier layer 115 is wet etched. This allows further vertical recess to extend into the barrier layer 115. Using the protected etch operations, III-V transistors can be scaled to smaller and larger sizes without sacrificing external resistance.

In FIG. 4C, a gate 149 is deposited into the bottom of the well over the barrier layer 115 The gate may be made of PtAu or any of a variety of other materials and may be formed using metal evaporation (physical vapor deposition—PVD) and lift-off processes. The gate deposition also results in metal deposition 145, 147 over both photo resist layers 141, 143. In addition, due to the lateral undercut of the barrier layer 115 under the photo resist 141, 143, the gate is isolated from the etch stop 117 and n+ cap 119 layers. As indicated in FIG. 4B, the barrier layer is not etched all the way through to the quantum well 113 layer below it. The gate 149 is therefore deposited directly on the well that is formed in the barrier layer. The effect caused by the barrier layer on the deposited gate can be controlled by controlling the second pass wet etch process.

When the metal gate layer will serve as an N-type workfunction metal, the metal used preferably has a workfunction that is between about 3.9 eV and about 4.2 eV. N-type materials that may be used to form the metal layer include hafnium, zirconium, titanium, tantalum, aluminum, and metal carbides that include these elements, i.e., titanium carbide, zirconium carbide, tantalum carbide, hafnium carbide and aluminum carbide. The metal layer may be thick enough to ensure that any material formed on it will not significantly impact its workfunction. Preferably, the metal layer is between about 25 Å and about 300 Å thick, and more preferably is between about 25 Å and about 200 Å thick.

When the metal layer will serve as a P-type workfunction metal, the metal used preferably has a workfunction that is between about 4.9 eV and about 5.2 eV. P-type materials that may be used to form the metal layer include ruthenium, palladium, platinum, cobalt, nickel, and conductive metal oxides, e.g., ruthenium oxide. Again, the metal layer may be thick enough to ensure that any material formed on it will not significantly impact its workfunction. Preferably, the metal layer is between about 25 Å and about 300 Å thick, and more preferably is between about 25 Å and about 200 Å thick.

Figure 4D:
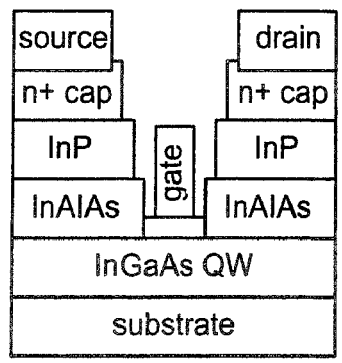
FIG. 4D is a cross-sectional diagram of the formation of FIG. 4C after the photo resist is removed according to an embodiment of the present invention.

In FIG. 4D, the resist layers are removed also removing the upper deposition layers 145, 147, leaving the deep well transistor with a source 121, drain 123, and central gate 149. The transistor in this form may then be finished with an inter layer dielectric (ILD) layer (not shown) or any other further processing as may be appropriate depending on the particular application for the transistor.

Figure 5:
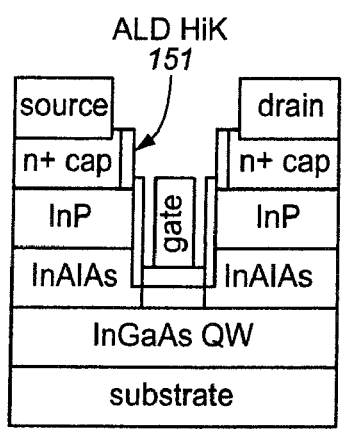
FIG. 5 is a cross-sectional diagram of the formation of FIG. 4D with a gate dielectric between the gate and the well according to an embodiment of the present invention.

As shown in FIG. 5, a high-k dielectric can be integrated into the structure of FIG. 4D. In FIG. 5, a blanket ALD high-k layer 151 serves both as a gate dielectric as well as a thin spacer to separate the gate metal from the source and drain. The ALD layer may be formed of hafnium-based oxides and silicates in a variety of different formulations depending on the intended application. As a spacer, the ALD layer may have a lower k to reduce fringe capacitance. As a gate dielectric a higher k may be desired to increase device capacitance and charge. In addition the gate dielectric may be selected to provide good interface properties to the III-V layer. The best materials may be selected to provide an appropriate balance of the desired characteristics. Such material may include aluminates, lantanates, and zirconium based oxides, among others.

As explained above the deposited gate dielectric layer functions as both a gate oxide and a thin spacer that isolates the source and drain regions from the later formed metal gate electrode. The high-k dielectric layer may be formed using materials known for their applicability in gate stacks for integrated circuit structures. In implementations of the invention, a high-k dielectric material may be chosen that has a dielectric constant (k) that is similar to or higher than the dielectric constant of the underlying III-V layer.

Some of the materials that may be used for the dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some implementations, a laminate oxide or a composite oxide may be used. Although a few examples of materials that may be used to form high-k gate dielectric layer are described here, that layer may be made from other materials.

This layer can be formed by depositing the ALD after the second wet etching process of FIG. 3B and before depositing the gate shown in FIG. 3C. In such a process, the barrier layer 115 may be etched before the high-k layer is deposited. Alternatively, the resist shown in FIG. 3B may be removed and a new resist layer patterned over just the source and drain. The ALD layer may then be deposited to cover the barrier layer 115, the etch stop layer 117 and the sides of the n+ cap layer 119. This resist may then be removed and another resist layer similar to that shown in FIG. 3C may be patterned over the structure. With this resist layer, the gate 149 may be deposited over the ALD layer.

As in the example of FIG. 4D, after the ALD and gate layer are formed as in FIG. 5, further processing operations may be performed. These operations may include the application of an ILD layer, additional other layers, etc. to finish the gate.

While the transistors of FIGS. 4D and 5 are particularly useful for logic circuits, they may be applied to many other purposes.

Figure 6:
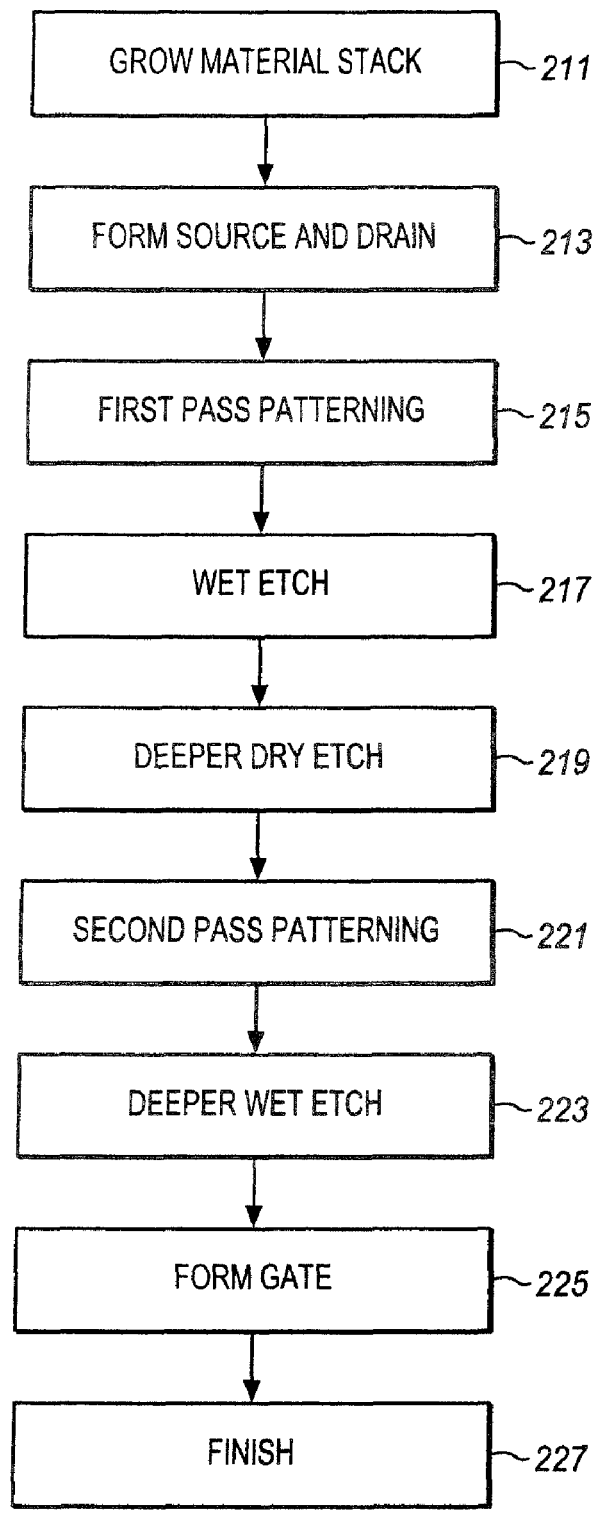
FIG. 6 is a process flow diagram for creating a transistor according to an embodiment of the present invention.

FIG. 6 shows a process flow for creating a transistor as described above. At block 211 the process begins with growing a material stack, such as that shown in FIG. 1. The material stack may be take a variety of different forms. The particular stack shown in FIG. 1 is particularly well-suited to particular types of logic circuits, however the illustrated configuration is not essential to the invention.

At block 213, terminals, in this case a source and drain, are formed over the material stack. FIG. 2 shows one possible configuration for the source and drain. Typically source and drain are formed of NiGeAu or TiPtAu, however other material may be used. A good ohmic contact (with low metal metal work function in the case of n-type transistors as shown and described in the current example may improve the operation of the resulting circuit. As such any n-type metals, including Al may be used. The particular position and configuration can be adapted to suit any particular application. In addition, the particular number and types of electrodes can be modified to create other types of devices in addition to or instead of the illustrated transistor.

At block 215, photo resist patterning is created for the first pass etching. In the illustrated example, the resist is patterned over the source and drain with a gap between the source and drain to allow the etching to create a well between the electrodes. The width of the resist is enough to cover the tops and sides of the metal source and drain and is selected to create a well of the desired width.

At block 217, a wet etch is performed to etch out a first layer between the resist layers. In the example of FIG. 3B, the layer is an n+ cap layer. In one example, sulfuric:peroxide or citric:peroxide based etches are used because they etch InGaAs but do not etch InP (so InP serves as an etch stop). In principle (and depending on the choice of material stack choice) any etchant that is selective to the etch stop layer is may be used. The particular layer and the number of layers can be adapted to suit any particular application.

At block 219, after the wet etch, a deeper dry etch is performed. In the example illustrated in FIG. 3C, this etch removes another layer from the material stack. An Ar-based sputter (physical) etch without any chemical component to it may be used to etch the InP etch stop layer. Other etches that do not significantly harm the underlying device layers may be used instead. The particular layer and number of layers removed in the wet etch can be adapted and adjusted as desired.

At block 221, the resist layers are removed and a new resist pattern is formed for a second pass at etching the well. This new resist pattern protects the layers that were etched in the first pass and leaves a gap between the resist to allow a still deeper etch into the material stack.

At block 223, a deeper wet etch is performed around the resist layers. This etch may pass through all of one or more layers or, as illustrated in FIG. 4B, it may etch through only a portion of a barrier layer. For this wet etch InAlAs may be used in a slow, controlled manner. Slower etchants such as citric:peroxide with varying proportions of the two chemicals may be used, in ratios of 2:1, to 20:1.

At block 225, a gate is formed in the bottom of the etched well. The gate together with the source and drain form the foundation of a transistor structure. For other types of structures, different electrodes may be formed. In the illustrated example, the gate is formed with the second resist pattern still in place. The second resist pattern ensures that the gate material is deposited only in the well. The gate may be formed from the same materials as described above for the terminals, such as PtAu. The gate may be deposited using metal evaporation (PVD) techniques. However any high work function metal (such as Pt) may be substituted.

At block 227, the structure is finished. This may include removing the photo resist, adding barrier and insulating layers, adding electrodes or vias to connect to the source, drain, and gate, adding dielectric layers and any of a variety of other processes. Upon completion, the resulting die including the illustrated transistors can be sealed and packaged for use as a central processing unit, hub, bridge, interface, controller, or any other type of integrated circuit.

In the present description, various aspects of the illustrative implementations are described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations are described as multiple discrete operations, in turn, in a manner that is most helpful in understanding the present invention, however, the order of description should not be construed to imply that these operations are necessarily order dependent. In particular, these operations need not be performed in the order of presentation.

The example cleaning processes described above are provided only as examples. There may be other and different chemical processes that break down, convert to gas or otherwise eliminate photo-induced defects on a mask. The example above show how combinations of illumination, heat, and exposure to gases such as air, oxygen, and water vapor can partially or completely eliminate these compounds and reduce the amount of or completely eliminate a wide range of different types of photo-induced defects from a photomask surface. The particular combination of illumination, heat, vacuum and other parameters may be selected with the above examples in mind. Alternatively, the particular combination may be selected based on the parameters described above and then optimized using trial and error.

A lesser or more complex transistor structure, well formation and process therefor may be used than those shown and described herein. Therefore, the configurations may vary from implementation to implementation depending upon numerous factors, such as price constraints, performance requirements, technological improvements, or other circumstances. Embodiments of the invention may also be applied to other types of transistor structures with deep quantum well configurations than those shown and described herein.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In addition, steps and operations may be removed or added to the operations described to improve results or add additional functions. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A method comprising:
    forming a first photolithography pattern over terminals on a material stack,
        wherein the terminals comprise a source and a drain of a deep well transistor;
    etching a well between the terminals using the first photolithography patterning;
    removing the first photolithography pattern;
    forming a second photolithography pattern over the terminals and at least a portion of the well;
    deepening the well between the terminals by etching using the second photolithography pattern;
    removing the second photolithography pattern; and
    finishing the terminals and the well to form a device on the material stack.

2. The method of claim 1, wherein the terminals are formed of low resistivity metals.

3. The method of claim 1, wherein etching using the first photolithography pattern comprises a wet etch followed by a dry etch.

4. The method of claim 1, wherein the wet etch comprises peroxide-based etch.

5. The method of claim 4, wherein the dry etch comprises a sputter etch.

6. The method of claim 4, wherein the sputter etch has no chemical component.

7. The method of claim 1, wherein etching using the second photolithography pattern comprises a wet etch.

8. The method of claim 1, wherein etching using the first photolithography pattern comprises removing portions of layers of the material stack between the terminals and wherein forming a second photolithography pattern comprises covering edges of layers exposed in etching the well.

9. The method of claim 1, wherein forming a second photolithography pattern over at least a portion of the well comprises applying photo resist to layers that have been exposed during etching the well.

10. The method of claim 1, further comprising depositing a gate in the well.

11. The method of claim 10, further comprising applying dielectric to the well before depositing the gate and wherein depositing the gate comprises depositing the gate over the dielectric.

* * * * *